United States Patent
Kim et al.

(10) Patent No.: US 12,206,420 B2
(45) Date of Patent: Jan. 21, 2025

(54) DUTY CYCLE MONITORING METHOD AND APPARATUS FOR MEMORY INTERFACE

(71) Applicant: ELECTRONICS AND TELECOMMUNICATIONS RESEARCH INSTITUTE, Daejeon (KR)

(72) Inventors: Yi-Gyeong Kim, Daejeon (KR); Young-Su Kwon, Daejeon (KR); Su-Jin Park, Daejeon (KR); Young-Deuk Jeon, Sejong-si (KR); Min-Hyung Cho, Daejeon (KR); Jae-Woong Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 13 days.

(21) Appl. No.: 18/223,101

(22) Filed: Jul. 18, 2023

(65) Prior Publication Data

US 2024/0195399 A1     Jun. 13, 2024

(30) Foreign Application Priority Data

Dec. 8, 2022    (KR) ........................ 10-2022-0170888
Mar. 21, 2023    (KR) ........................ 10-2023-0036489

(51) Int. Cl.
    *H03K 5/156*          (2006.01)
    *G06F 1/12*            (2006.01)
    (Continued)

(52) U.S. Cl.
    CPC ............. *H03K 5/1565* (2013.01); *G06F 1/12* (2013.01); *G11C 11/4076* (2013.01);
    (Continued)

(58) Field of Classification Search
None
See application file for complete search history.

(56) References Cited

U.S. PATENT DOCUMENTS 8,665,665 B2    3/2014    Huang
8,698,529 B2    4/2014    Nam et al.
(Continued)

FOREIGN PATENT DOCUMENTS

KR    10-2019-0029204 A    3/2019
KR    10-2022-0071470 A    5/2022
(Continued)

*Primary Examiner* — Cassandra F Cox
(74) *Attorney, Agent, or Firm* — LRK PATENT LAW FIRM

(57) ABSTRACT

Disclosed herein are a duty cycle monitoring method and apparatus for a memory interface, including receiving a clock signal as input and generating a first delay time offset and a second delay time offset, receiving the clock signal and the first delay time offset and then outputting a first delayed signal, receiving the first delayed signal and the second delay time offset and then outputting a second delayed signal, receiving the clock signal and the second delayed signal and then outputting a delay value corresponding to a half-period of the clock signal, and monitoring, based on the first delayed signal, whether a duty cycle of the clock signal conforms to a duty cycle specification.

12 Claims, 14 Drawing Sheets

(51) Int. Cl.
    *G11C 11/4076*     (2006.01)
    *H03K 5/131*       (2014.01)
    *H03K 5/135*       (2006.01)
    *H03L 7/081*       (2006.01)
    *H03K 5/00*        (2006.01)

(52) U.S. Cl.
    CPC ............ *H03K 5/131* (2013.01); *H03K 5/135* (2013.01); *H03L 7/0812* (2013.01); *H03K 2005/00058* (2013.01)

(56) References Cited

U.S. PATENT DOCUMENTS

| | | |
|---|---|---|
| 10,819,326 B1 | 10/2020 | Yang et al. |
| 11,509,297 B2 | 11/2022 | Lee et al. |
| 11,651,813 B2 | 5/2023 | Choi et al. |
| 2009/0146708 A1* | 6/2009 | Yun .......................... H03L 7/07 327/158 |
| 2010/0171537 A1* | 7/2010 | Lee ....................... H03L 7/0814 327/158 |
| 2019/0081619 A1 | 3/2019 | Kim et al. |

FOREIGN PATENT DOCUMENTS

| | | |
|---|---|---|
| KR | 10-2399541 B1 | 5/2022 |
| KR | 10-2022-0096555 A | 7/2022 |

* cited by examiner

DUTY CYCLE MONITORING METHOD AND APPARATUS FOR MEMORY INTERFACE

CROSS REFERENCE TO RELATED APPLICATIONS

This application claims the benefit of Korean Patent Application Nos. 10-2022-0170888, filed Dec. 8, 2022 and 10-2023-0036489, field Mar. 21, 2023, which are hereby incorporated by reference in their entireties into this application.

BACKGROUND OF THE INVENTION

1. Technical Field

The present disclosure relates to duty cycle monitoring technology for a memory interface. More particularly, the present disclosure relates to technology that is capable of monitoring a duty cycle in background.

2. Description of Related Art

A memory system transmits data, together with a clock, at a Double Data Rate (DDR). Here, when the duty cycle of the clock falls out of a specification, a data capture error may occur. In order to prevent such a data capture error, the range of a duty cycle is specified in a memory interface standard, and a memory interface requires a duty cycle monitoring function.

Current technologies for monitoring a duty cycle are problematic in that they need to adjust a duty cycle together with a duty cycle adjustment circuit, thus making it difficult to determine whether the duty cycle falls out of a specification in the background.

PRIOR ART DOCUMENTS

Patent Documents (Patent Document 1) Korean Patent Application Publication No. 2022-0071470 (Title of the invention: Clock Correction Circuit and Memory System Comprising the Clock Correction Circuit)

SUMMARY OF THE INVENTION

Accordingly, the present disclosure has been made keeping in mind the above problems occurring in the prior art, and an object of the present disclosure is to provide a duty cycle monitoring method based on a digital element.

Another object of the present disclosure is to monitor a duty cycle in background during the use of a memory interface.

In accordance with an aspect of the present disclosure to accomplish the above objects, there is provided a duty cycle monitoring method for a memory interface, including receiving a clock signal as input and generating a first delay time offset and a second delay time offset, receiving the clock signal and the first delay time offset and then outputting a first delayed signal, receiving the first delayed signal and the second delay time offset and then outputting a second delayed signal, receiving the clock signal and the second delayed signal and then outputting a delay value corresponding to a half-period of the clock signal, and monitoring, based on the first delayed signal, whether a duty cycle of the clock signal conforms to a duty cycle specification.

The first delayed signal and the second delayed signal may be generated based on the delay value.

The first delay time offset may be a value obtained by multiplying a delay coefficient by the delay value, and the second delay time offset may be a value having an absolute value identical to that of the first delay time offset and having a sign different from that of the first delay time offset.

The delay coefficient may be set based on an operating specification of a duty cycle desired to be detected.

Generating the first delay time offset and the second delay time offset may include additionally receiving the delay value, and a first delay time and a second delay time may be generated such that a sum thereof is twice the delay value.

Monitoring whether the duty cycle of the clock signal conforms to a duty cycle specification may include sampling the clock signal on a rising edge or a falling edge of the first delayed signal, and monitoring whether the duty cycle of the clock signal conforms to the a duty cycle specification using a sampling count obtained for a preset time.

In accordance with another aspect of the present disclosure to accomplish the above objects, there is provided a duty cycle monitoring apparatus for a memory interface may includes an offset generator for receiving a clock signal as input and generating a first delay time offset and a second delay time offset, a first delay circuit for receiving the clock signal and the first delay time offset and then outputting a first delayed signal, a second delay circuit for receiving the first delayed signal and the second delay time offset and then outputting a second delayed signal, a delay-locked loop for receiving the clock signal and the second delayed signal and then outputting a delay value corresponding to a half-period of the clock signal, and a monitoring circuit for monitoring, based on the first delayed signal, whether a duty cycle of the clock signal conforms to a duty cycle specification.

The first delayed signal and the second delayed signal may be generated based on the delay value.

The first delay time offset may be a value obtained by multiplying a delay coefficient by the delay value, and the second delay time offset may be a value having an absolute value identical to that of the first delay time offset and having a sign different from that of the first delay time offset.

The delay coefficient may be set based on an operating specification of a duty cycle desired to be detected.

Each of the first delay circuit and the second delay circuit may additionally receive the delay value, and a first delay time and a second delay time may be generated such that a sum thereof is twice the delay value.

The monitoring circuit may sample the clock signal on a rising edge or a falling edge of the first delayed signal, and may monitor whether the duty cycle of the clock signal conforms to the a duty cycle specification using a sampling count obtained for a preset time.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Figure 1:
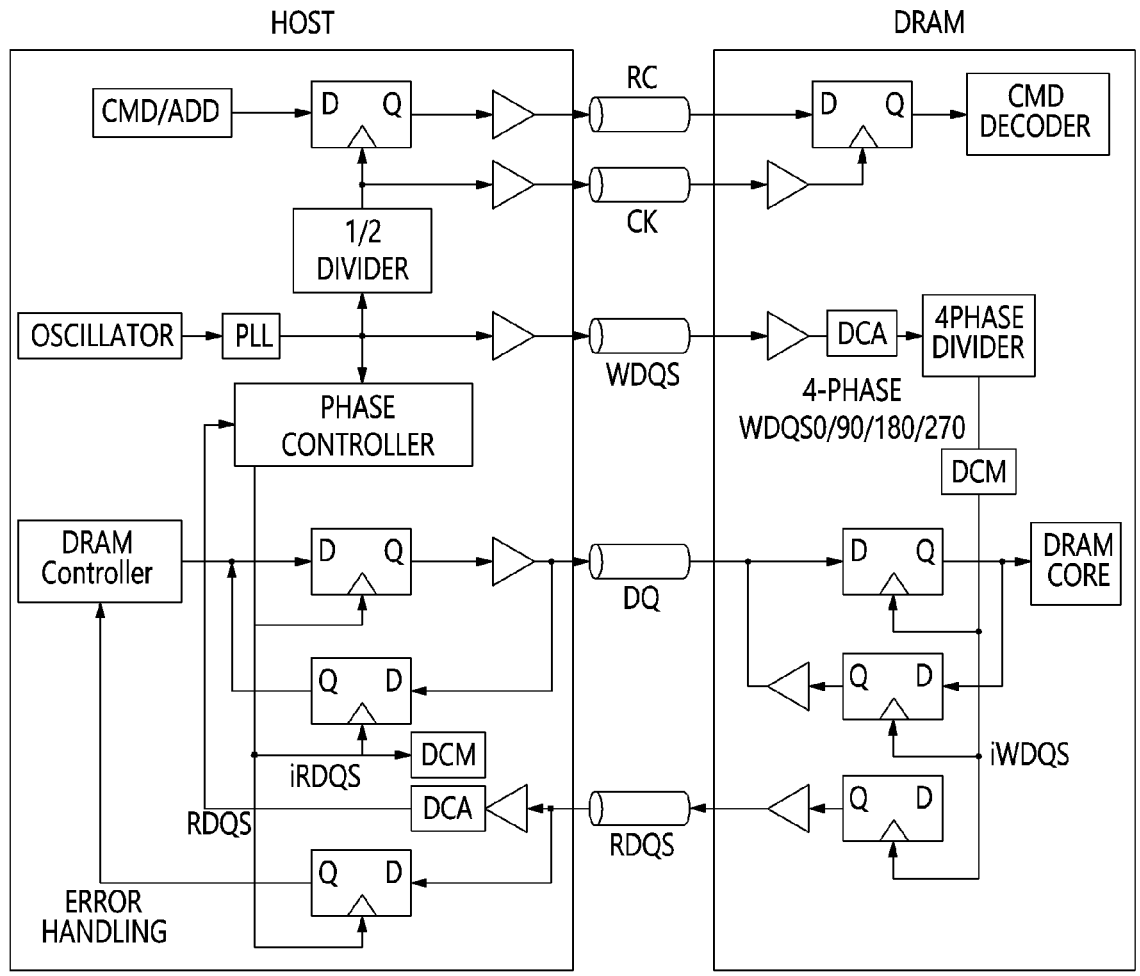
FIG. 1 illustrates an example of the configuration of a memory interface circuit.

Advantages and features of the present disclosure and methods for achieving the same will be clarified with reference to embodiments described later in detail together with the accompanying drawings. However, the present disclosure is capable of being implemented in various forms, and is not limited to the embodiments described later, and these embodiments are provided so that this disclosure will be thorough and complete and will fully convey the scope of the present disclosure to those skilled in the art. The present disclosure should be defined by the scope of the accompanying claims. The same reference numerals are used to designate the same components throughout the specification.

It will be understood that, although the terms "first" and "second" may be used herein to describe various components, these components are not limited by these terms. These terms are only used to distinguish one component from another component. Therefore, it will be apparent that a first component, which will be described below, may alternatively be a second component without departing from the technical spirit of the present disclosure.

The terms used in the present specification are merely used to describe embodiments, and are not intended to limit the present disclosure. In the present specification, a singular expression includes the plural sense unless a description to the contrary is specifically made in context. It should be understood that the term "comprises" or "comprising" used in the specification implies that a described component or step is not intended to exclude the possibility that one or more other components or steps will be present or added.

In the present specification, each of phrases such as "A or B", "at least one of A and B", "at least one of A or B", "A, B, or C", "at least one of A, B, and C", and "at least one of A, B, or C" may include any one of the items enumerated together in the corresponding phrase, among the phrases, or all possible combinations thereof.

Unless differently defined, all terms used in the present specification can be construed as having the same meanings as terms generally understood by those skilled in the art to which the present disclosure pertains. Further, terms defined in generally used dictionaries are not to be interpreted as having ideal or excessively formal meanings unless they are definitely defined in the present specification.

Hereinafter, embodiments of the present disclosure will be described in detail with reference to the accompanying drawings. In the following description of the present disclosure, the same reference numerals are used to designate the same or similar elements throughout the drawings and repeated descriptions of the same components will be omitted.

FIG. 1 illustrates an example of the configuration of a memory interface circuit.

Figure 2:
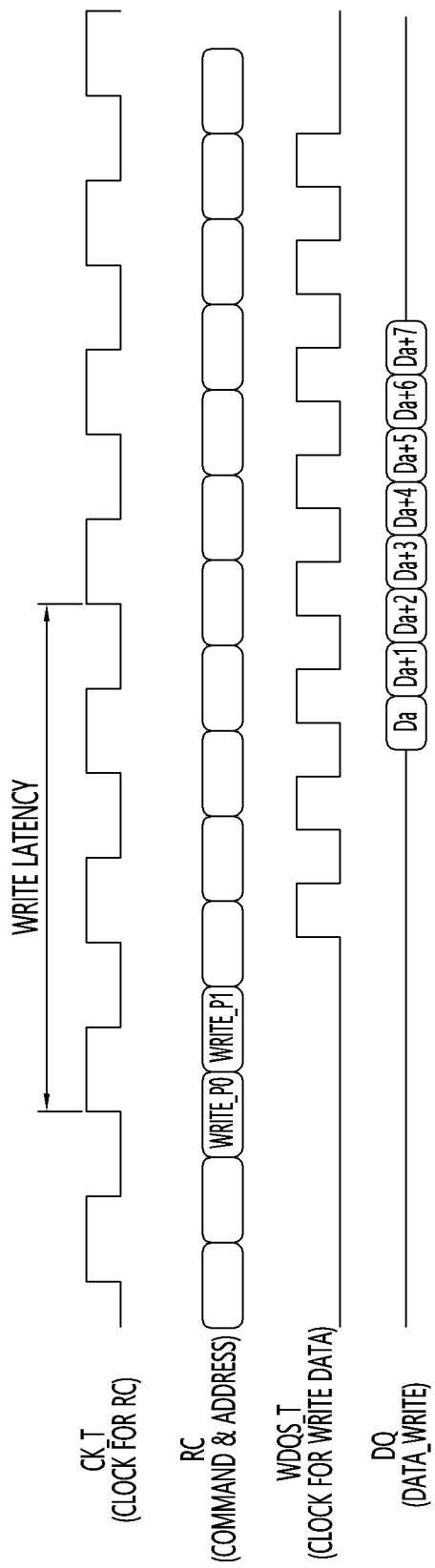
FIG. 2 illustrates an example of clock and data transmission when a write operation is performed.

FIG. 2 illustrates an example of clock and data transmission when a write operation is performed.

The memory interface circuit transmits data together with a clock, as illustrated in FIG. 2. When a write operation is performed, a host transmits a command & address (RC) to memory in synchronization with a clock CK. After a certain period of time has elapsed, the host transmits data, together with a clock WDQS, to the memory.

Figure 3:
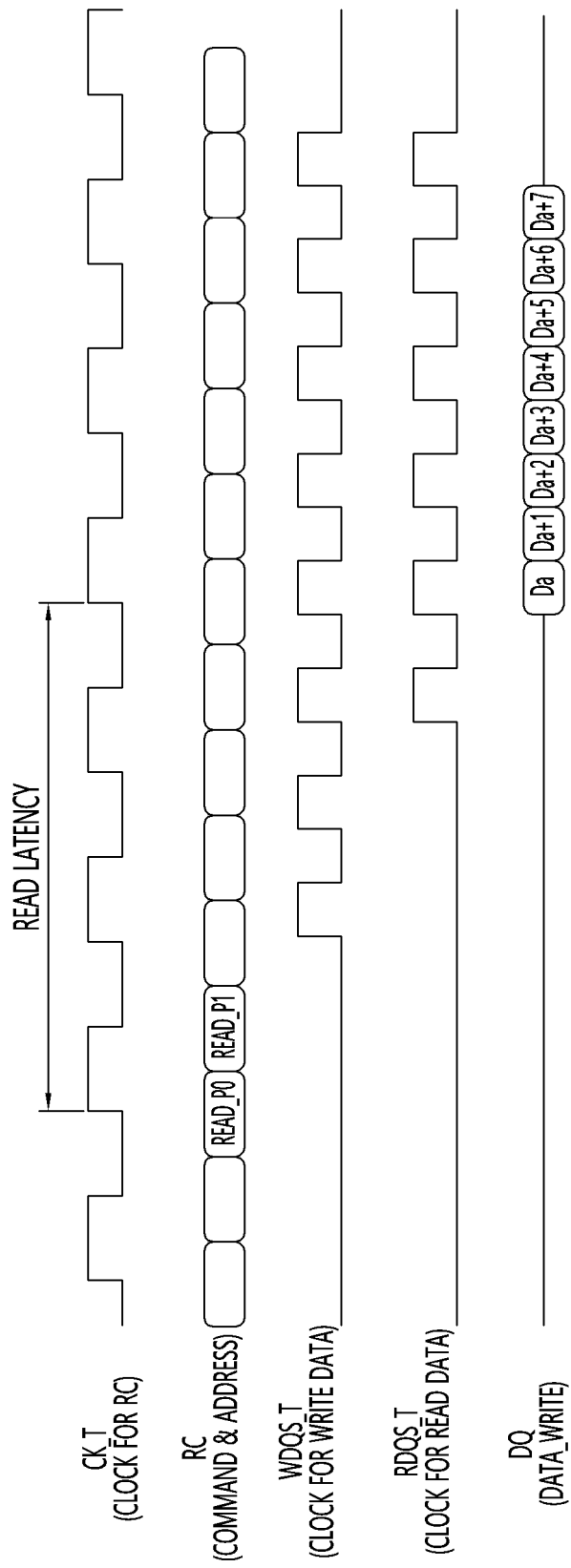
FIG. 3 illustrates an example of clock and data transmission when a read operation is performed.

FIG. 3 illustrates an example of clock and data transmission when a read operation is performed.

White a read operation is performed, the host transmits a command & address (RC) to the memory in synchronization with a clock CK. After a certain period of time, data, together with a clock RDQS, is transmitted from the memory to the host. When the write and read operations are performed, data is transmitted at a Double Data Rate (DDR) so as to improve data transfer efficiency per clock. When data is transmitted at DDR, the data may be captured at two edges, that is, the rising edge and the falling edge of the clock for data WDQS or RDQS.

Figure 4:
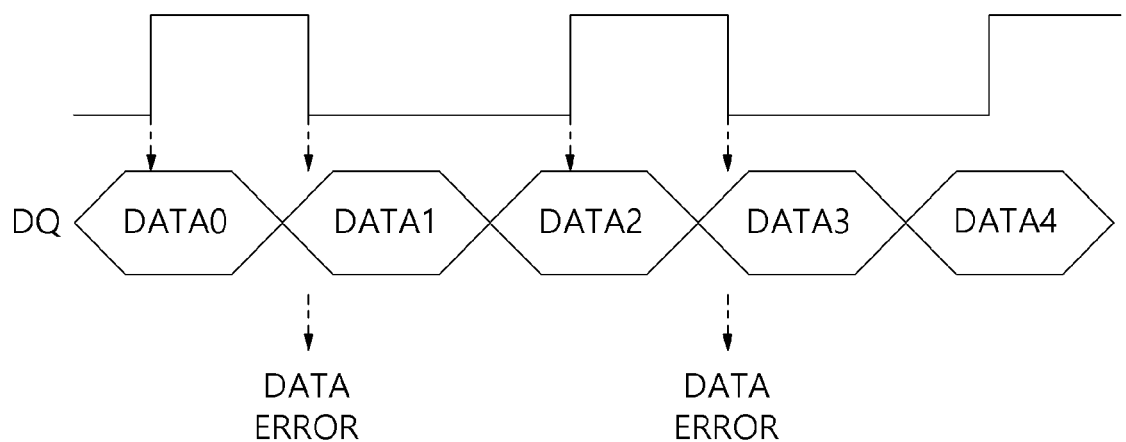
FIG. 4 illustrates an example of occurrence of a data capture error.

FIG. 4 illustrates an example of occurrence of a data capture error.

Figure 5:
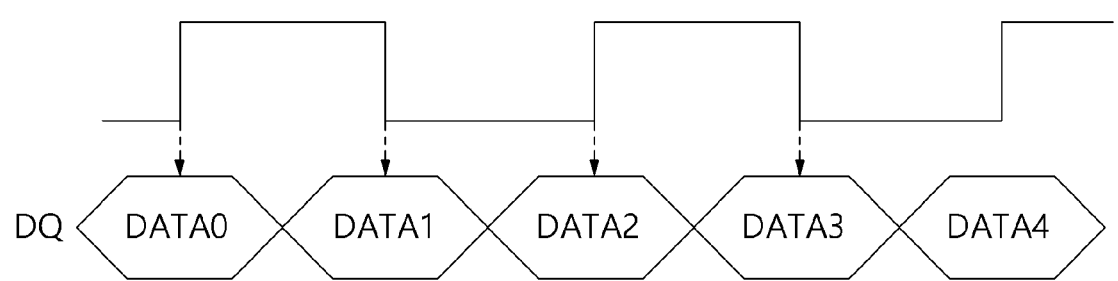
FIG. 5 illustrates an example in which data is captured by adjusting a clock delay and a duty cycle.

FIG. 5 illustrates an example in which data is captured by adjusting a clock delay and a duty cycle.

As the clock speed and the data transfer rate of a memory interface are increased, a function of adjusting the duty cycle of the clock depending on a DDR operation may be required. In order to adjust the duty cycle of the clock, a host adjusts a delay time and the duty cycle between the clock and data through a training procedure during initial driving. When the delay time and the duty cycle of the clock at which data is captured are not accurate, a data capture error may occur, as illustrated in FIG. 4. When the delay time and the duty cycle are adjusted, data may be captured without an error, as illustrated in FIG. 5. However, when the temperature and the supply voltage of a chip vary depending on the operation of the chip after the initial driving of the host and the memory, the timing delay and the duty cycle of the host and the memory interface circuit in the memory may vary. In order to determine whether retraining is required depending on such voltage and temperature (VT) variation, a delay time and duty cycle monitoring circuit is contained in each of the host and the memory interface.

Figure 6:
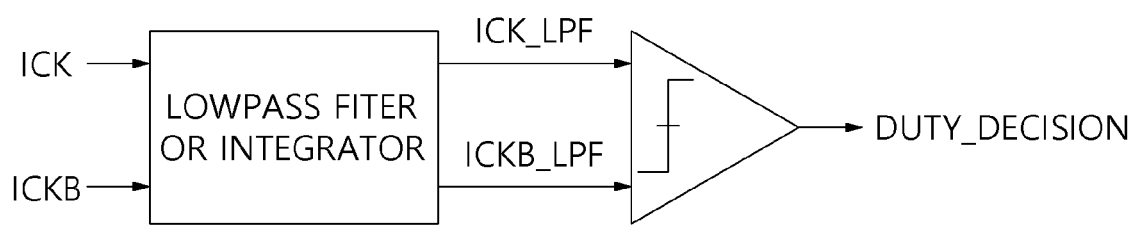
FIG. 6 illustrates an example of a duty cycle monitoring circuit.

FIG. 6 illustrates an example of a duty cycle monitoring circuit.

Figure 7:
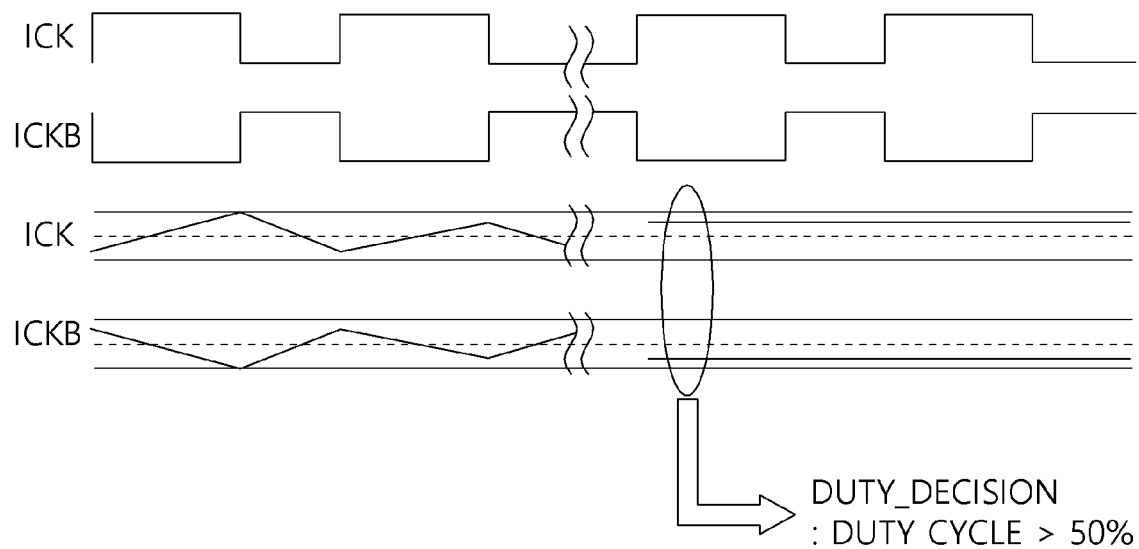
FIG. 7 illustrates a duty cycle monitoring method using the circuit of FIG. 6.

FIG. 7 illustrates a duty cycle monitoring method using the circuit of FIG. 6.

The circuit of FIG. 6 is an example of a duty cycle monitoring circuit that uses a low pass filter (or an integrator) and a comparator. In FIGS. 6 and 7, clock signals ICK and ICKB are signals having opposite phases. The low pass filter receives the clock signals ICK and ICKB, and transfers the averages of the clock signals depending on the duty cycle thereof to the comparator. The comparator determines whether the duty cycle of the two signals is higher than or lower than 50% by comparing the voltages of the two signals with each other, and outputs the result of determination.

This structure has limitations in that a differential clock signal is to be necessarily received and the low pass filter having a low frequency bandwidth is to be used, thus needing multiple clock cycles required for obtaining an average value, with the result that the clock signal needs to be maintained for multiple periods. Therefore, in the example of FIG. 6, when a clock is transmitted only during data transmission, as in the case of a memory interface for low power data transmission, it is not suitable to monitor the duty cycle. Further, because only whether the duty cycle is higher than or lower than 50% can be known, the duty cycle may be adjusted by utilizing the monitoring circuit together with a duty cycle error correction module (duty error corrector), but a problem arises in that it is impossible to determine whether a duty cycle falls out of an error range in the background during the use of the memory interface.

Figure 8:
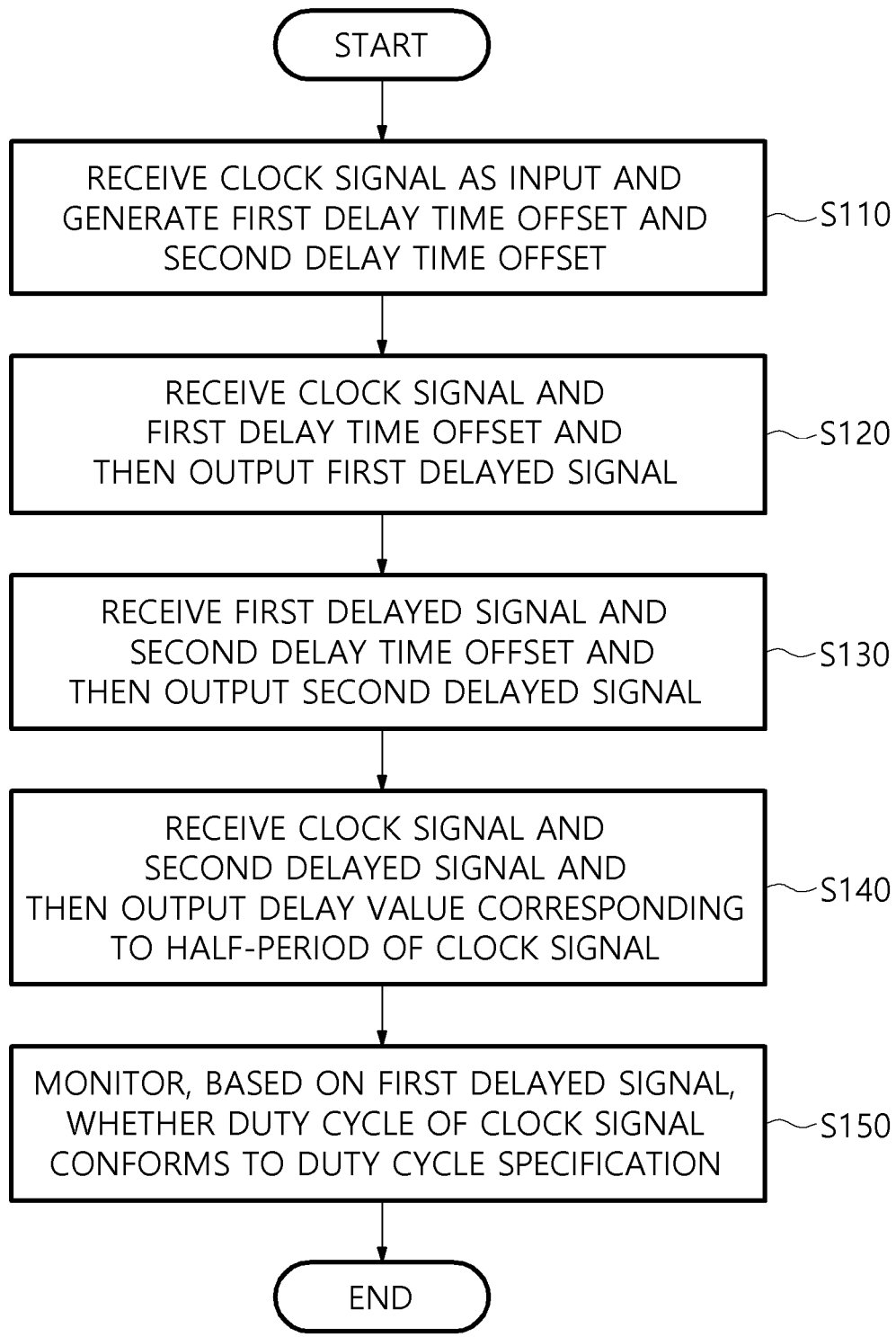
FIG. 8 is a flowchart illustrating a duty cycle monitoring method for a memory interface.

FIG. 8 is a flowchart illustrating a duty cycle monitoring method for a memory interface.

Referring to FIG. 8, the duty cycle monitoring method for a memory interface according to an embodiment of the present disclosure includes step S110 of receiving a clock signal as input and generating a first delay time offset and a second delay time offset, step S120 of receiving the clock signal and the first delay time offset and then outputting a first delayed signal, step S130 of receiving the first delayed signal and the second delay time offset and then outputting a second delayed signal, step S140 of receiving the clock signal and the second delayed signal and then outputting a delay value corresponding to the half-period of the clock signal, and step S150 of monitoring, based on the first delayed signal, whether the duty cycle of the clock signal conforms to a duty cycle specification.

Here, the first delayed signal and the second delayed signal may be generated based on the delay value.

Here, the first delay time offset may correspond to a value obtained by multiplying a delay coefficient by the delay value, and the second delay time offset may correspond to a value having the same absolute value as the first delay time offset and having a sign different from that of the first delay time offset.

Here, the delay coefficient may be set based on the operation specification of the duty cycle desired to be detected.

Here, step S110 of generating the first delay time offset and the second delay time offset may include the step of additionally receiving the delay value, wherein a first delay time and a second delay time may be generated such that the sum of the first delay time and the second delay time is twice the delay value.

Step S150 of monitoring whether the duty cycle of the clock signal conforms to the duty cycle specification may include the step of sampling the clock signal at the rising edge or the falling edge of the first delayed signal and the step of monitoring whether the duty cycle of the clock signal conforms to the duty cycle specification using a sampling count obtained for a preset time.

Figure 9:
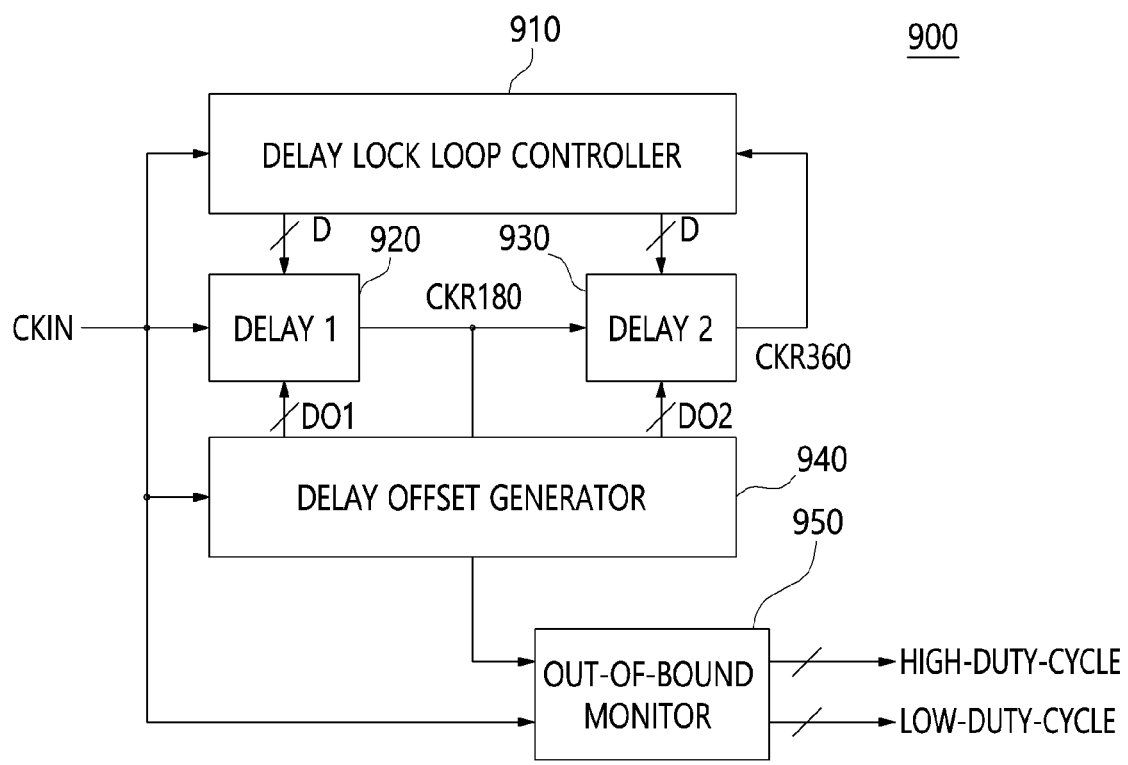
FIG. 9 illustrates an example of a duty cycle monitoring circuit according to an embodiment of the present disclosure.

FIG. 9 illustrates an example of a duty cycle monitoring circuit according to an embodiment of the present disclosure.

Referring to FIG. 9, the duty cycle monitoring circuit according to an embodiment of the present disclosure may include the following elements.
  (1) Circuit (delay-locked loop controller) 910 for receiving an input clock signal CKIN and the output signal CKR360 of delay circuit 2 and then outputting a delay time value D so that the phases of the input clock signal and the output signal of delay circuit 2 become identical to each other
  (2) Delay circuit 1 (Delay 1) 920 for receiving the input clock signal CKIN, delaying the input clock signal using delay time input values D and DO1, and outputting a delayed signal
  (3) Delay circuit 2 (Delay 2) 930 for receiving the output CKR180 of delay circuit 1, delaying the output signal CKR180 of delay circuit 1 using delay time input values D and DO2, and outputting a delayed signal
  (4) Delay offset generation circuit (i.e., delay offset generator) 940 for outputting delay time offset 1 (DO1) and delay time offset 2 (DO2) so that the difference between the delay times of delay circuit 1 and delay circuit 2 occurs
  (5) Circuit (Out-of-bound monitor) 950 for outputting information indicating whether the duty cycle of the clock falls out of a clock cycle specification using the input clock signal and the output of delay circuit 1

In this case, the delay offset generator 940 may generate the delay time offsets by complementarily setting the delay times of delay circuit 1 920 and delay circuit 2 930. For example, in accordance with an embodiment of the present disclosure, delay time offset 1 (DO1) may be set to 'aT', and delay time offset 2 (DO2) may be set to '-aT'. Here, T may be the period of the input clock signal.

In this case, the delay offset generator 940 may generate the corresponding delay time offset by increasing or decreasing the delay time of delay circuit 1 920.

Similarly, the delay offset generator 940 may generate the corresponding delay time offset by increasing or decreasing the delay time of delay circuit 2 930.

Figure 10:
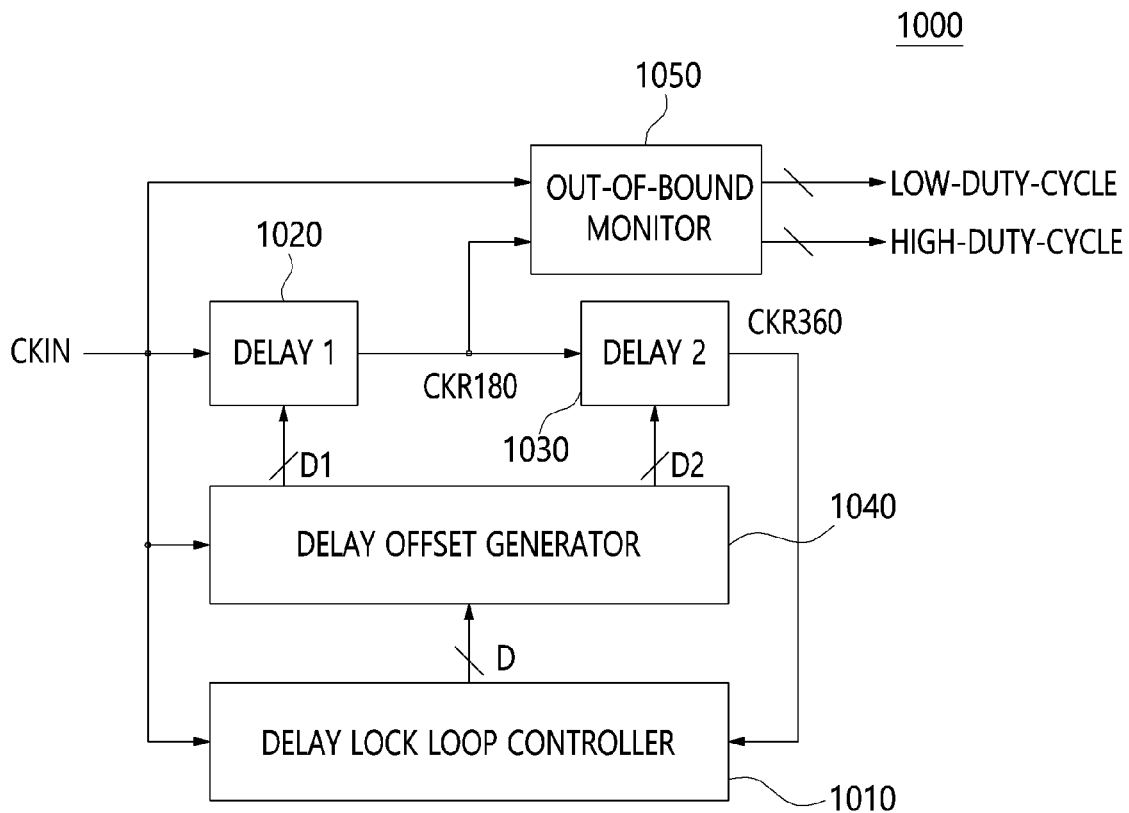
FIG. 10 illustrates an example of a duty cycle monitoring circuit according to another embodiment of the present disclosure.

FIG. 10 illustrates an example of a duty cycle monitoring circuit according to another embodiment of the present disclosure.

Referring to FIG. 10, the duty cycle monitoring circuit according to an embodiment of the present disclosure may include the following elements.
  (1) Circuit (delay-locked loop controller) 1010 for receiving an input clock signal CKIN and the output signal CKR360 of delay circuit 2 and then outputting a delay time value D so that the phases of the input clock signal and the output signal of delay circuit 2 become identical to each other
  (2) Delay circuit 1 (Delay 1) 1020 for receiving the input clock signal CKIN, delaying the input clock signal using delay time input values D and DO1, and outputting a delayed signal
  (3) Delay circuit 2 (Delay 2) 1030 for receiving the output CKR180 of delay circuit 1, delaying the output signal CKR180 of delay circuit 1 using delay time input values D and DO2, and outputting a delayed signal
  (4) delay offset generation circuit (delay offset generator) 1040 for receiving the output D of a delay-locked loop controller, adding delay time offsets to the output D. and then outputting pieces of delay time information to delay circuit 1 and to delay circuit 2 so that the difference between the delay times of delay circuit 1 and delay circuit 2 occurs (5) Circuit (Out-of-bound monitor) 1050 for outputting information indicating whether the duty cycle of the clock falls out of a clock cycle specification using the input clock signal and the output of delay circuit 1

In this case, the delay offset generator 1040 may generate the delay time offsets by complementarily setting the delay times of delay circuit 1 1020 and delay circuit 2 1030. For example, according to an embodiment of the present disclosure, delay time offset 1(DO1) may be set to '0.5T+aT', and delay time offset 2 (DO2) may be set to '0.5T-aT'. Here, T may be the period of the input clock signal.

In this case, the delay offset generator 1040 may generate the corresponding delay time offset by increasing or decreasing the delay time of delay circuit 1 1020.

Similarly, the delay offset generator 1040 may generate the corresponding delay time offset by increasing or decreasing the delay time of delay circuit 2 1030.

Figure 11:
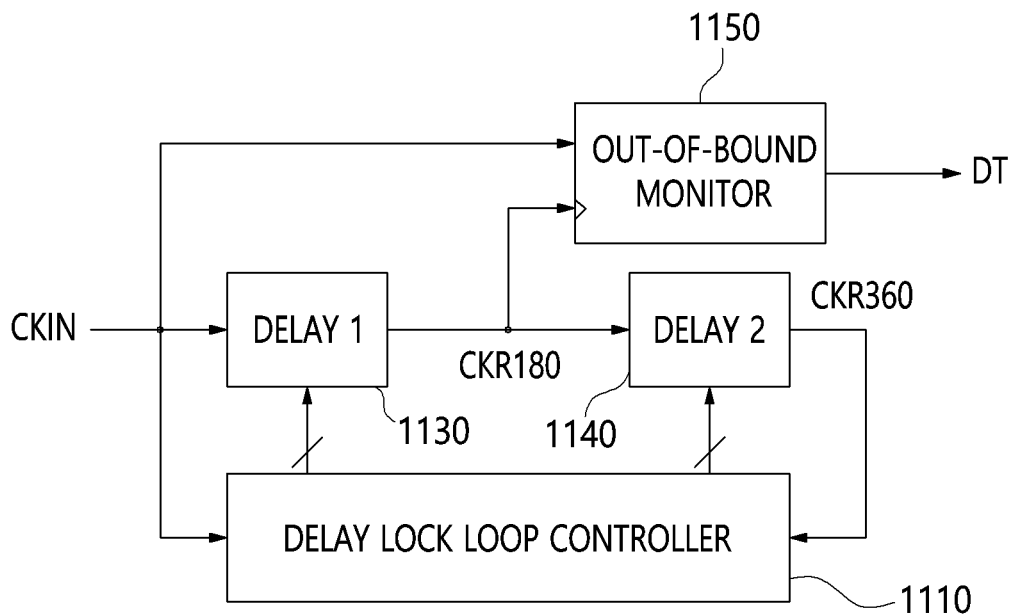
FIG. 11 illustrates an example of a duty cycle monitoring circuit.

FIG. 11 illustrates an example of a duty cycle monitoring circuit.

Figure 12:
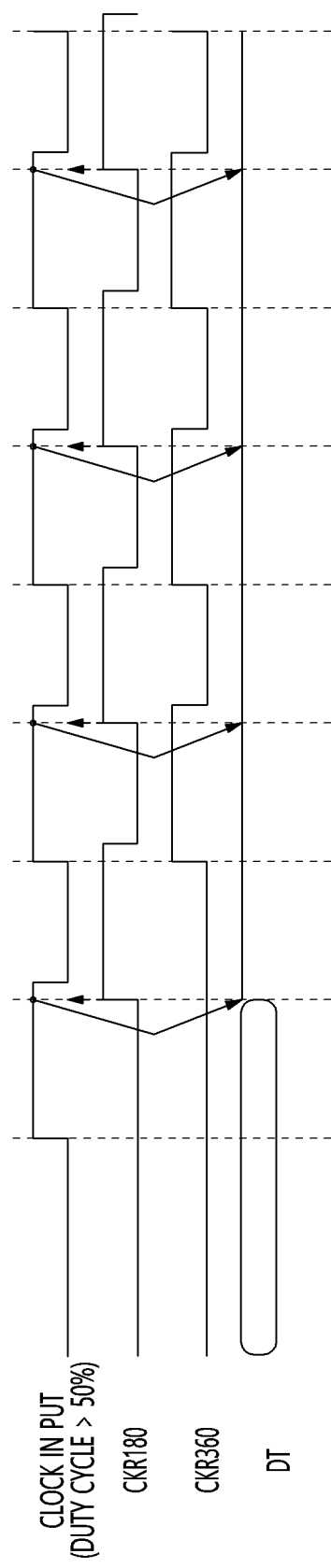
FIG. 12 is a timing diagram illustrating the case where a duty cycle exceeds 0.5.

FIG. 12 is a timing diagram illustrating the case where a duty cycle exceeds 0.5.

Figure 13:
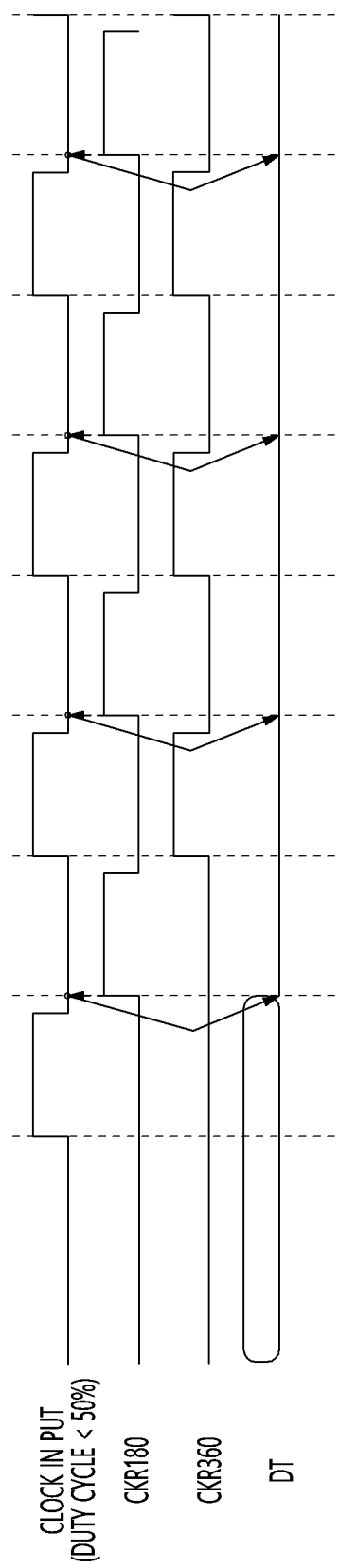
FIG. 13 is a timing diagram illustrating the case where a duty cycle is less than 0.5.

FIG. 13 is a timing diagram illustrating the case where a duty cycle is less than 0.5.

Hereinafter, a method of operating the circuit of FIG. 11 will be described in detail with reference to FIGS. 12 and 13.

A Delay-Locked Loop (DLL) in the duty cycle monitoring circuit of FIG. 11 may include delay circuits 1130 and 1140, which are capable of adjusting delay times, and a delay-locked loop controller 1110, which compares the phases of an input clock and the outputs of the delay circuits and adjusts the delay values of the delay circuits 1130 and 1140 so that the difference between the phases is one period. By the delayed-locked loop, as illustrated in FIGS. 12 and 13, the rising edges of the input clock signal CKIN and the output of delay circuit 2 (Delay 2), that is, a waveform CKR360, coincide with each other, with a difference of one period therebetween. When delay circuit 1 (Delay1) and delay circuit 2 (Delay 2) are implemented as the same circuit, they have the same delay value, and thus the output CKR180 of delay circuit 1 (Delay 1) has a phase of 180 degrees. Therefore, the circuit of FIG. 11 may check whether the duty cycle of the input clock signal CKIN is higher than/lower than 50% by sampling the input clock signal CKIN using the signal CKR180.

However, because the circuit of FIG. 11 is capable of detecting only whether the duty cycle is higher than/lower than 50%, the memory interface cannot monitor whether the duty cycle of the clock falls out of an operation specification.

Figure 14:
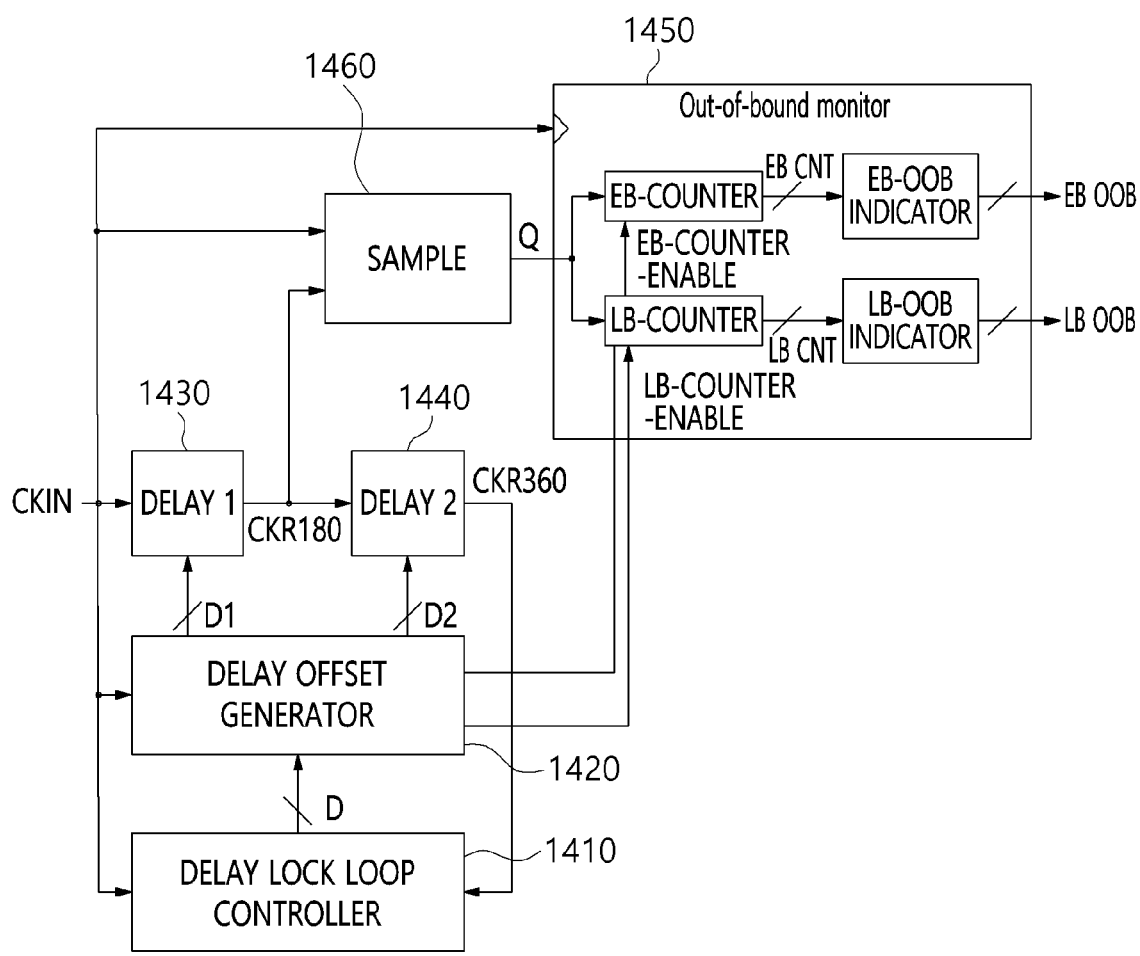
FIG. 14 illustrates an example of a duty cycle monitoring circuit according to an embodiment of the present disclosure.

FIG. 14 illustrates an example of a duty cycle monitoring circuit according to an embodiment of the present disclosure.

Referring to FIG. 14, the duty cycle monitoring circuit according to an embodiment of the present disclosure may include the following elements.

(1) Circuit (delay-locked loop controller) 1410 for receiving an input clock signal CKIN and the output signal CKR360 of delay circuit 2 and then outputting a delay time value D so that the phases of the input clock signal and the output signal of delay circuit 2 become identical to each other (2) Delay circuit 1 (Delay 1) 1430 for receiving the input clock signal CKIN, delaying the input clock signal using delay time input values D and DO1, and outputting a delayed signal (3) Delay circuit 2 (Delay 2) 1440 for receiving the output CKR180 of delay circuit 1, delaying the output signal CKR180 of delay circuit 1 using delay time input values D and DO2, and outputting a delayed signal (4) Delay offset generation circuit (i.e., delay offset generator) 1420 for outputting delay time offset 1 (DO1) and delay time offset 2 (DO2) so that the difference between the delay times of delay circuit 1 and delay circuit 2 occurs (5) Sampler 1460 for sampling the input clock signal CKIN using the output CKR180 of delay circuit 1

(6) Circuit (out-of-band monitor) 1450 for outputting information indicating whether the duty cycle of the input clock signal falls out of a duty cycle specification Here, the out-of-bound monitor 1450 may include circuits (EB-counter and LB-counter), which count the output Q of the sampler 1460 depending on the condition of the delay offset generator, and circuits (End of Burst-Out of Bounds (EB-OOB)-indicator and Leading Burst-Out of Bounds (LB-OOB)-indicator), which determine whether the duty cycle falls out of an error range based on the outputs of the counters.

Hereinafter, the operation of the circuit of FIG. 14 will be described in detail with reference to FIGS. 15 and 16.

Figure 15:
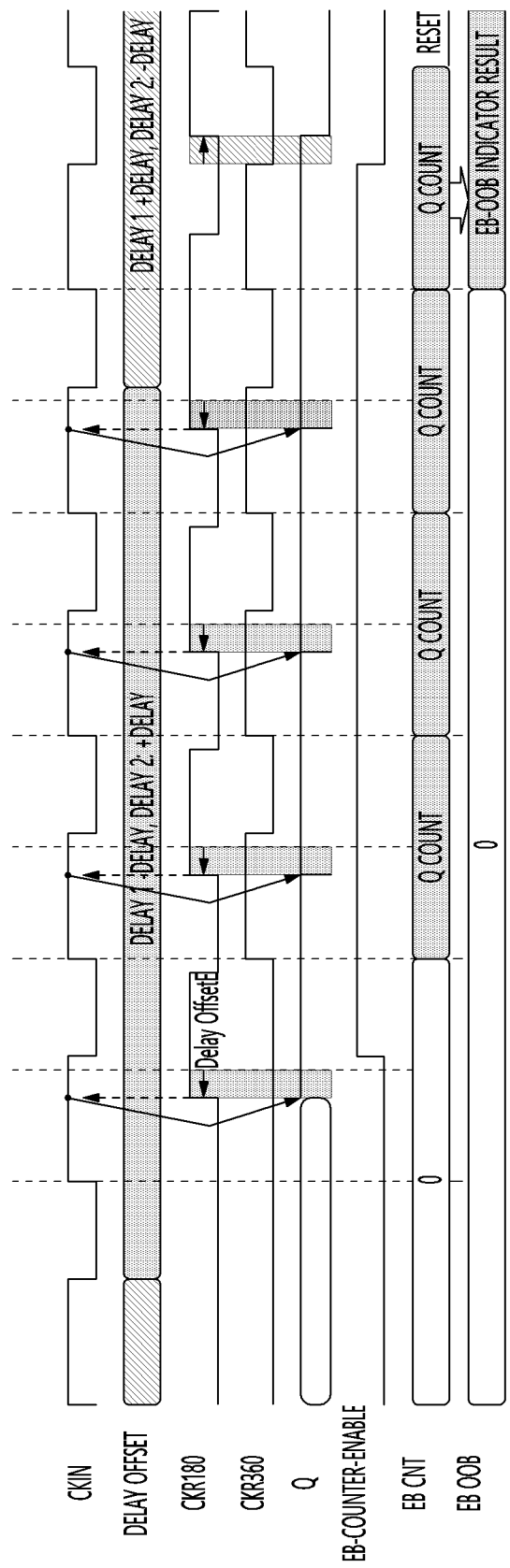
FIG. 15 is a timing diagram illustrating an example in which the phase of the output signal of delay circuit 1 is set to a value leading 180 degrees.

FIG. 15 is a timing diagram illustrating an example in which the phase of the output signal of delay circuit 1 is set to a value leading 180 degrees.

Referring to FIG. 15, it can be seen that the delay offset generator 1420 sets the delay time of delay circuit 1 (Delay 1) to be shorter than that of delay circuit 2 (Delay 2), or sets the delay time of delay circuit 2 (Delay 2) to be longer than that of delay circuit 1 (Delay 1). Since, in the entire circuit, the delay-locked loop is operated, the rising edges of the input clock signal CKIN and the output CKR360 of delay circuit 2 coincide with each other.

Here, because the delay time of delay circuit 1 is shorter than that of delay circuit 2, the rising edge of CKR180 leads a phase of 180 degrees (i.e., 0.5 period T). When the input clock signal CKIN is sampled using the signal CKR180, and the output value of the sampler is counted for a preset time, whether the falling edge of the input clock signal CKIN continuously falls out of the range thereof by a set delay offset DelayOffsetE may be determined.

Figure 16:
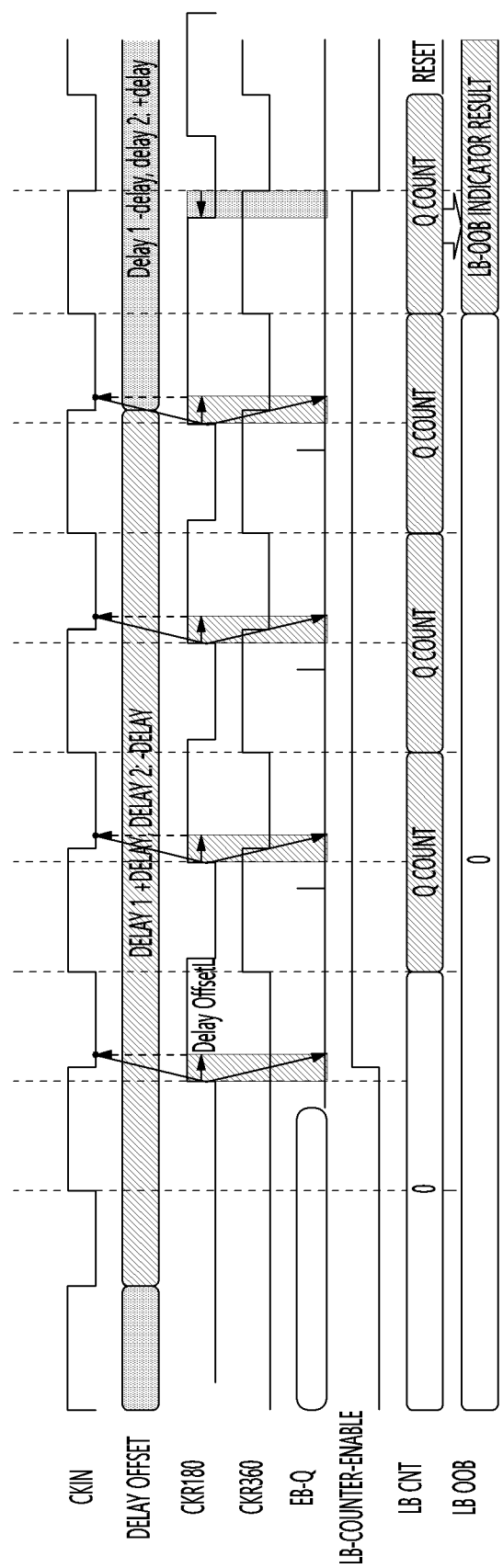
FIG. 16 is a timing diagram illustrating an example in which the phase of the output signal of delay circuit 1 is set to a value lagging behind 180 degrees.

FIG. 16 is a timing diagram illustrating an example in which the phase of the output signal of delay circuit 1 is set to a value lagging behind 180 degrees.

Referring to FIG. 16, it can be seen that the delay offset generator 1420 sets the delay value D2 to be greater than the delay value D1 or sets the delay value D1 to be less than the delay value D2. As described above, the input clock signal CKIN is sampled and counted using the signal CKR180, and thus whether the falling edge of the input clock signal CKIN continuously falls out of the range thereof by a set delay offset DelayOffsetL may be determined.

Figure 17:
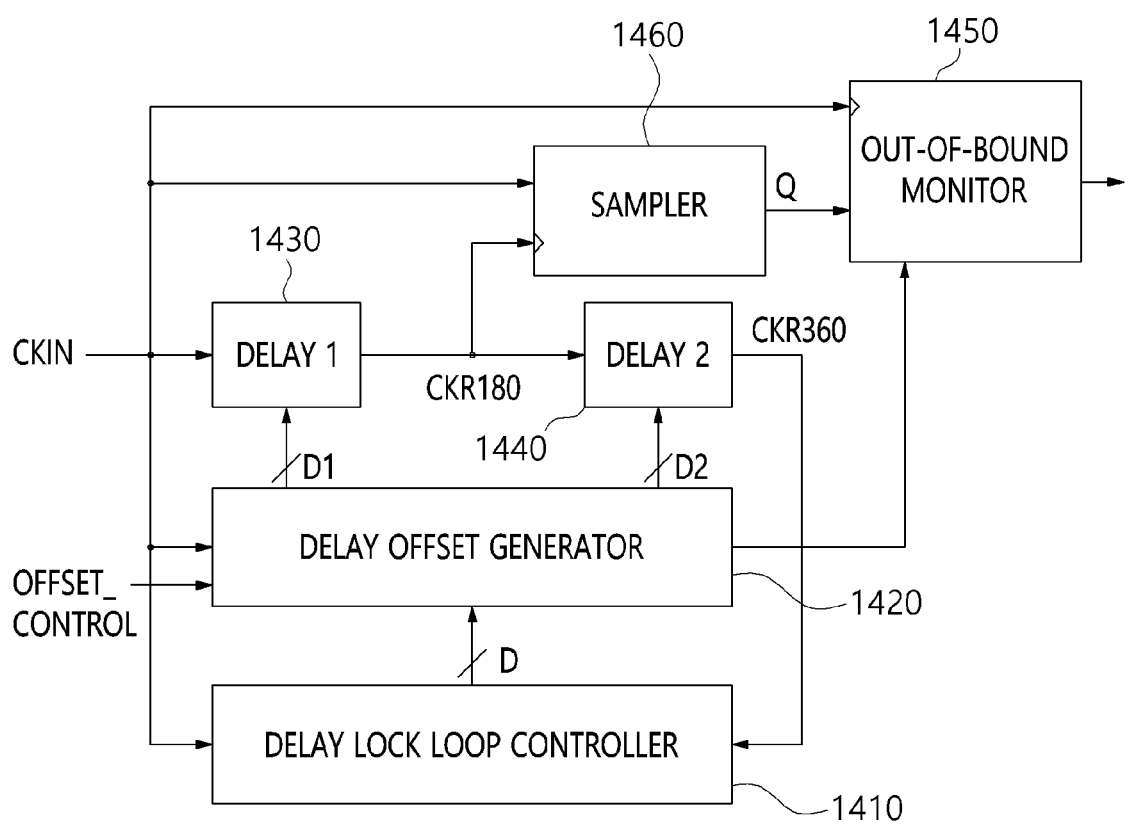
FIG. 17 illustrates an example of application of a circuit according to an embodiment of the present disclosure.

FIG. 17 illustrates an example of application of a circuit according to an embodiment of the present disclosure.

Referring to FIG. 17, it can be seen that the circuit is configured such that the delay offset of a delay offset generator is externally adjusted. While changing the delay offset of the delay offset generator to a positive specification value and to a negative specification value using an externally received signal OFFSET_CONTROL (i.e., a control signal including delay offsets desired to be adjusted), the output result OOB of an out-of-bound monitor may be checked, and then the duty cycle of a clock signal may be monitored. The circuit illustrated in FIG. 17 may programmably control a duty cycle specification value, a duty cycle monitoring period, etc.

A duty cycle monitoring apparatus for a memory interface according to an embodiment of the present disclosure includes an offset generator for receiving a clock signal as input and generating a first delay time offset and a second delay time offset, a first delay circuit for receiving the clock signal and the first delay time offset and then outputting a first delayed signal, a second delay circuit for receiving the first delayed signal and the second delay time offset and then outputting a second delayed signal, a delay-locked loop for receiving the clock signal and the second delayed signal and then outputting a delay value corresponding to a half-period of the clock signal, and a monitoring circuit for monitoring, based on the first delayed signal, whether a duty cycle of the clock signal conforms to a duty cycle specification.

Here, the first delayed signal and the second delayed signal may be generated based on the delay value.

Here, the first delay time offset may be a value obtained by multiplying a delay coefficient by the delay value, and the second delay time offset may be a value having an absolute value identical to that of the first delay time offset and having a sign different from that of the first delay time offset.

Here, the delay coefficient may be set based on an operating specification of a duty cycle desired to be detected.

Here, each of the first delay circuit and the second delay circuit may additionally receive the delay value, and a first delay time and a second delay time may be generated such that a sum thereof is twice the delay value.

Here, the monitoring circuit may sample the clock signal on a rising edge or a falling edge of the first delayed signal, and may monitor whether the duty cycle of the clock signal conforms to the a duty cycle specification using a sampling count obtained for a preset time.

Specific executions described in the present disclosure are embodiments, and the scope of the present disclosure is not limited to specific methods. For simplicity of the specification, descriptions of conventional electronic components, control systems, software, and other functional aspects of the systems may be omitted. As examples of connections of lines or connecting elements between the components illustrated in the drawings, functional connections and/or circuit connections are exemplified, and in actual devices, those connections may be replaced with other connections, or may be represented by additional functional connections, physical connections or circuit connections. Furthermore, unless definitely defined using the term "essential", "significantly" or the like, the corresponding component may not be an essential component required in order to apply the present disclosure.

According to the present disclosure, there can be provided a duty cycle monitoring method based on a digital element.

The present disclosure may monitor a duty cycle in background during the use of a memory interface.

Therefore, the spirit of the present disclosure should not be limitedly defined by the above-described embodiments, and it is appreciated that all ranges of the accompanying claims and equivalents thereof belong to the scope of the spirit of the present disclosure.

What is claimed is:

1. A duty cycle monitoring method for a memory interface, comprising:
   receiving a clock signal as input and generating a first delay time offset and a second delay time offset;
   receiving the clock signal and the first delay time offset and then outputting a first delayed signal;
   receiving the first delayed signal and the second delay time offset and then outputting a second delayed signal;
   receiving the clock signal and the second delayed signal and then outputting a delay value corresponding to a half-period of the clock signal; and
   monitoring, based on the first delayed signal, whether a duty cycle of the clock signal conforms to a duty cycle specification.

2. The duty cycle monitoring method of claim 1, wherein the first delayed signal and the second delayed signal are generated based on the delay value.

3. The duty cycle monitoring method of claim 2, wherein:
   the first delay time offset is a value obtained by multiplying a delay coefficient by the delay value, and
   the second delay time offset is a value having an absolute value identical to that of the first delay time offset and having a sign different from that of the first delay time offset.

4. The duty cycle monitoring method of claim 3, wherein the delay coefficient is set based on an operating specification of a duty cycle desired to be detected.

5. The duty cycle monitoring method of claim 1, wherein:
   generating the first delay time offset and the second delay time offset comprises:
   additionally receiving the delay value, and
   a first delay time and a second delay time are generated such that a sum thereof is twice the delay value.

6. The duty cycle monitoring method of claim 1, wherein monitoring whether the duty cycle of the clock signal conforms to a duty cycle specification comprises:
   sampling the clock signal on a rising edge or a falling edge of the first delayed signal, and monitoring whether the duty cycle of the clock signal conforms to the a duty cycle specification using a sampling count obtained for a preset time.

7. A duty cycle monitoring apparatus for a memory interface, comprising:
   an offset generator for receiving a clock signal as input and generating a first delay time offset and a second delay time offset;
   a first delay circuit for receiving the clock signal and the first delay time offset and then outputting a first delayed signal;
   a second delay circuit for receiving the first delayed signal and the second delay time offset and then outputting a second delayed signal;
   a delay-locked loop for receiving the clock signal and the second delayed signal and then outputting a delay value corresponding to a half-period of the clock signal; and
   a monitoring circuit for monitoring, based on the first delayed signal, whether a duty cycle of the clock signal conforms to a duty cycle specification.

8. The duty cycle monitoring apparatus of claim 7, wherein the first delayed signal and the second delayed signal are generated based on the delay value.

9. The duty cycle monitoring apparatus of claim 8, wherein:
   the first delay time offset is a value obtained by multiplying a delay coefficient by the delay value, and
   the second delay time offset is a value having an absolute value identical to that of the first delay time offset and having a sign different from that of the first delay time offset.

10. The duty cycle monitoring apparatus of claim 9, wherein the delay coefficient is set based on an operating specification of a duty cycle desired to be detected.

11. The duty cycle monitoring apparatus of claim 7, wherein:
- each of the first delay circuit and the second delay circuit additionally receives the delay value, and
- a first delay time and a second delay time are generated such that a sum thereof is twice the delay value.

12. The duty cycle monitoring apparatus of claim 7, wherein the monitoring circuit samples the clock signal on a rising edge or a falling edge of the first delayed signal, and monitors whether the duty cycle of the clock signal conforms to the a duty cycle specification using a sampling count obtained for a preset time.

* * * * *